United States Patent [19]
Pastor et al.

[11] 3,959,442
[45] May 25, 1976

[54] PREPARING SINGLE CRYSTALS OF Li(Ho,Y,Er,Tm,Dy)F4 IN HF ATMOSPHERE

[75] Inventors: Ricardo C. Pastor, Manhattan Beach; Morton Robinson, Malibu, both of Calif.

[73] Assignee: Hughes Aircraft Company, Culver City, Calif.

[22] Filed: Mar. 7, 1974

[21] Appl. No.: 449,148

[52] U.S. Cl. .................. 423/263; 252/301.4 H; 156/617; 23/305 RE; 23/273 SP
[51] Int. Cl.² .................. B01J 17/18; C09K 1/04; C01D 11/02
[58] Field of Search .......... 252/301.4 H; 23/301 SP, 23/273 SP, 302, 305 RE; 423/21, 185, 463, 464, 263; 156/617

[56] References Cited
UNITED STATES PATENTS 3,649,552   3/1972   Robinson ...................... 23/305 RE

OTHER PUBLICATIONS

Harmer et al., J. Phy. Chem. Solids, 1969, Vol. 30, pp. 1483–1491.
Sharp et al., J. Appl. Phy., Vol. 44, No. 12, Dec, 1973, pp. 5399 to 5401.
Uhrin et al., Prep. and Sin. Crys. Growth of LiYF$_4$ Laser Matls, AD–775211, Feb. 1974, pp. 15 to 30.
Chicklis, Devel of Multi Sentsitized KO:YLF Asp. Laser Material, Jan. 1973, AD–755–530, pp. 3 to 5.
Byer, Journal of Applied Physics, Vol. 41, No. 6, May, 1970, pp. 2320 to 2322.
Morrison, HDL–TR–1621, Studies Relative to Pass Laser Pumped by Nuclear Beta Rays, Oct. 1973, pp. 1 to 7.
Remski, IEEE Journal of Quantum Electronics, Apr. 1969, p. 214.

Primary Examiner—Stephen J. Emery
Assistant Examiner—S. J. Emery
Attorney, Agent, or Firm—B. T. Hogan; W. H. MacAllister

[57] ABSTRACT

Single crystals, useful as laser emission compounds, having the formula ARF$_4$ wherein A is potassium, sodium, or lithium, and R is holmium, yttrium, erbium, or dysprosium are prepared by a direct congruent melt crystal growth process that yields crystals exhibiting substantially superior physical and chemical characteristics compared to those grown by conventional methods.

10 Claims, No Drawings

PREPARING SINGLE CRYSTALS OF Li(Ho,Y,Er,Tm,Dy)F$_4$ IN HF ATMOSPHERE

RELATED APPLICATIONS

This is the latest of a series of patent applications disclosing various applications of the concept of reactive atmospheric processing that have been filed by the inventors and others which have a common assignee.

In U.S. application Ser. No. 275,130, filed July 26, 1972, now U.S. Pat. No. 3,826,817, granted July 30, 1974, by A. C. Pastor and R. C. Pastor, the use of dissociated carbon halide gas to convert a metal salt to the corresponding metal halide is disclosed.

In U.S. application Ser. No. 334,179, filed February 20, 1973, now abandoned, by R. C. Pastor, a process whereby molten metal halides are passed through a bed of carbon particles to remove oxide and hydroxide impurities is disclosed.

In U.S. application Ser. No. 349,516, filed Apr. 9, 1973 by R. C. Pastor, the treatment of metal halide laser window surfaces by exposure to gaseous nascent halogens for the purpose of improving structural properties and optical transmission is disclosed.

In U.S. application Ser. No. 351,214, filed Apr. 16, 1973 By R. C. Pastor and A. Timper, we disclosed that alkali metal halides may be purified, prior to their use as starting materials for the growth of alkali metal halide crystals, by scrubbing the material in its molten form with gaseous nascent halogens which correspond to the halide anion.

In U.S. application Ser. No. 416,899, filed Nov. 19, 1973, now abandoned, by R. C. Pastor, an improved alkali metal halide purification method is disclosed whereby the crystal growth starting materials are purified by scrubbing with halide-source species in their vapor phase and cast in the form of an ingot to be used directly in subsequent halide crystal growth processes.

In U.S. application Ser. No. 446,581, filed Feb. 27, 1974, by R. C. Pastor, Kaneto Arita and Morton Robinson, an invention directed to the preparation of laser windows from single metallic component halide crystals purified by regrowth from the congruent melt is disclosed.

BACKGROUND OF THE INVENTION

1. Field of the Invention

This invention is concerned with the preparation of single crystals from the congruent melt of dual component metallic fluorides for use as laser emission materials.

2. Description of the Prior Art

Crystals of the formula ARF$_4$ have been used as laser emission materials prior to this invention. LiYF$_4$, in particular, has been grown by a process based on the accepted proposition that the material melts incongruently. "Phase Equilibria in the System LiF-YF$_3$," by R. E. Thoma et al., *J. Phys. Chem.* 65, 1096 (1961). This proportion of incongruency is extended to many rare earth compounds, LiF—RF$_3$, where R ranges from Eu to Ho. "The Rare Earth Halides," by R. E. Thoma, *Progress in Science and Technology of the Rare Earths*, Vol. 2, edited by LeRoy Eyring (Pergamon, 1966). Accepting the incongruency behavior, LiYF$_4$ has been grown. "Single Crystal Growth and Some Properties of LiYF$_4$," by W. A. Shand, *J. Cryst. Growth*, 5, 143 (1969). However, the incongruent growth process has two outstanding drawbacks. The first is a forced slow rate of growth, necessitated by the composition mismatch, and the second is the change of growth temperature as a function of the amount of crystal formed from a given starting amount of melt. In the case of LiYF$_4$, incongruent growth is conducted on the Li rich LiYF. These drawbacks are avoided in our congruent growth process which yields crystals of vastly improved quality at a substantially faster growth rate.

According to E. P. Chicklis et al. in *Research and Development Technical Report* TRECOM-00130F, Sanders Associates, Inc., January, 1973, entitled "Development of Multiply Sensitized Ho:YLF as a Laser Material," crystals of αβ—YLF (LiY$_{1-x-y-z}$Er$_x$Tm$_y$Ho$_z$F$_4$) are grown by the Top-Seeded Solution technique, a modification of the Czochralski technique, in an atmosphere of highly purified helium. In the system LiF—YF$_3$, incongruently melting LiYF$_4$ crystallizes as the primary phase over the composition range 51–75 mol % LiF. Although in the corresponding system LiF—ErF$_3$, LiErF$_4$ is congruently melting, in the mixed crystal system LiYF$_4$.LiErF$_4$ the incongruent melting behavior of LiYF$_4$ prevails. Thulium and holmium are not present in sufficient amounts to effect the observable phase equilibrium. E. P. Chicklis et al "Development of Multiply Sensitized Ho:YLF as a Laser Material", *Research and Development Technical Report TRECOM*-0013-F Sanders Associates, Inc, January 1973.

In U.S. Pat. No. 3,649,552 it was disclosed, by one of the applicants herein, that an HF purge during crystal growth would lead to the production of ultra high purity rare earth fluoride crystals and solid state solutions of rare earth fluorides and alkaline earth fluorides. The process disclosed has become known as the "Reactive Atmosphere Processing" method. We have found that this process can be utilized to remove the peritectic character of ARF$_4$ compounds, thereby allowing one to promote crystal growth from the congruent melt and form dual component single crystals of rare earth fluorides and alkali fluorides. This discovery is contra to published literature and commonly accepted beliefs of those who are skilled in the art of rare earth halide crystal growth.

The "Reactive Atmosphere Process" was applied to the growth of calcium fluoride-rare earth fluoride fluorescent compounds in U.S. Pat. No. 3,769,230. The present invention discloses that the techniques utilized to grow Ca$_2$Er$_5$F$_{19}$ can be adopted to grow congruent crystals of equimolar alkali metal-rare earth fluorides such as LiYF$_4$ contra to published literature which states that these materials melt incongruently.

SUMMARY OF THE INVENTION

We have discovered that a reactive atmosphere processing method can be used to promote the growth of single crystals from the congruent melt of equimolar alkali metal fluorides and rare earth fluorides thereby forming compounds having the formula ARF$_4$, wherein A is lithium and R is holmium, yttrium, erbium or dysprosium. Single crystals of these compounds have, heretofore, been grown from the peritectic melt with all of the problems associated with this method. Crystals grown from the congruent melt by our process are substantially superior to those grown by conventional crystal growth techniques. This congruent melt technique, while contrary to the teachings of prior art in ARF$_4$ crystal growth, has been shown to facilitate greater control over the growth process whereby crystals of increased purity are obtained. As such, these crystals are particularly useful as laser emitters and also as laser window materials for 2–6 μm range laser applications.

DESCRIPTION OF THE INVENTION

We have found that the peritectic like breakdown during cool down in the preparation of equimolar alkali metal rare earth halide crystals can be attributed to the presence of OH⁻ impurities which promote an incongruent melt behavior. Suppression of the OH⁻ content of halide melts tends to raise the melting points and render possible congruent melt behavior.

The OH⁻ may be suppressed or removed entirely by causing the ratio of $P_{H_2O}/P_{HX}$ to be as low as possible in the following exchange:

$$X^-(c) + H_2O(g) \rightleftarrows OH^-(c) + HX(g) \tag{1}$$

where (c) stands for the melt or crystal at the operating temperature of congruent growth and (g) for the vapor phase. We can write the equilibrium relation, $$C(c) = \frac{[OH^-(c)]}{[X^-(c)]} = K \frac{P_{H_2O}}{P_{HX}}, \tag{2}$$

which shows that the process parameter, $P_{H_2O}/P_{HX}$, of crystal growth is the key to the control of $C(c)$, or the OH⁻ content. The equilibrium constant, K, is fixed once the nature of the metal halide, HX, is specified because at a total pressure of one atmosphere the melting point (operating temperature for congruent growth) is also fixed. The limit to the choice in the value of $P_{HX}$ is set by the solubility of HX in (c), to avoid the problem of trapped bubbles in the crystal. The value of $P_{H_2O}$ depends on the dewpoint of the source HX and the outgassing of surfaces in the growth apparatus.

In practice, we have found that compounds, of the formula ARF₄, can be prepared directly from the congruent melt according to the following equation:

$$AF + RF_3 = ARF_4 \tag{3}$$

wherein A is lithium and R is holmium, yttrium, erbium, or dysprosium. Stoichiometric amounts of each starting material are placed into a suitable crucible, such as vitreous carbon or platinum, and inserted into a furnace. The furnace is then thoroughly outgassed via the application of a vacuum. Dry helium is introduced at a rate of approximately 2 STP-liters/minute whereby the furnace is then returned to atmosphere conditions. A reactive atmosphere is introduced by causing HF to flow into the furnace at approximately 3 STP-liters/hr. The temperature of the furnace is then increased to approximately 100°C above the anticipated melting point of ARF₄ and allowed to remain at that temperature for approximately 24 hours whereby the HF reacts with residual oxides found in the AF or RF₃ srarting materials. The constant flow of HF also causes the furnace to be purged of any H₂O vapor or oxygen which could react with AF or RF₃ to form additional oxides. Approximately 6 hours is allowed for the molten equimolar mixture of AF and RF₃ to react in the presence of HF and the temperature is then lowered to the proximity of the anticipated melting point of ARF₄. Crystal nucleation is initiated by lowering or causing a platinum rod to immerse into the melt as taught by Czochralski. The nucleated crystal is then slowly withdrawn to facilitate a single crystal growth. We obtain excellent results with LiYF₄, for example when a pull rate of from 3–12 mm/hr is used with a nucleation rod rotation rate of from 15–30 rpm.

After a crystal of the desired length has been obtained, the melt temperature and pull rate is then increased to pull the crystal from the melt. The temperature of the crystal and furnace is allowed to cool to room temperature prior to the termination of the HF flow and subsequent purge of the system with dry He. The crystal and rod may then be removed from the furnace and separated.

U.S. Pat. No. 3,769,230 issued to M. Robinson et al. on Oct. 30, 1973 contains detailed drawings of the Vertical Bridgman apparatus which is also applicable to the growth of ARF₄ crystals. Contra to well established beliefs, the equimolar mixture of fluorides of alkali metals and rare earth metals exhibit congruent melting characteristics when treated in a manner disclosed by this patent. This alteration of or change in melting behavior is believed to have been caused by the ability of this process to eliminate anion inpurities and significantly lower the OH⁻ concentration in the materials.

This process is also effective for growing single crystals of the formula AR'F₄ wherein R' is a combination of rare earth ions.

In view of the above disclosure and the utility of preparing large ultra pure single crystals of the formula ARF₄, the scope of our invention will now be understood.

We claim:

1. A method for preparing ultra pure single crystals of the formula ARF₄; wherein A is lithium and R is selected from the group consisting of holmium, yttrium, erbium, thulium and dysprosium; consisting of forming a congruent melting point ARF₄ compound by reacting molten AF and RF₃ in the presence of HF gas, allowing said compound to cool and pulling a single crystal from said congruent melt in the presence of HF wherein the forming a congruent melting point ARF₄ compound and crystal growth from the congruent melt consists of the steps of a. placing said fluorides into a crucible within a high temperature furnace;
    b. causing said furnace to be outgassed by applying a vacuum and purging said furnace with an inert gas;
    c. introducing a reactive atmosphere into said furnace by causing HF gas to flow into said furnace;
    d. causing said reactants to melt by slowly raising the temperature of said furnace until the melting point of said reactants has been exceeded whereby said reactants become molten;
    e. allowing said molten reactants with said reactive atmosphere at a steady state molten temperature for approximately 6 hours;
    f. reducing the temperature of said furnace to the proximity of the melting point of said reactants;
    g. causing said molten reactants to nucleate by immersing a nucleation rod into said reactant melt;
    h. pulling a single crystal on said nucleated rod by slowly withdrawing said rod from said melt while rotating said rod in said reactive atmosphere;
    i. causing said crystal to separate from said melt by increasing the temperature of said furnace and the pull rate of said rod; and
    j. allowing said crystal to cool to room temperature in the presence of said reactive atmosphere by decreasing the temperature of said furnace and purging said furnace with an inert gas.

2. The process of claim 1 wherein R is yttrium.

3. The process of claim 1 wherein R is erbium.

4. The process of claim 1 wherein R is a mixture of yttrium and erbium.

5. The process of claim 1 wherein R is holium.

6. A method for preparing ultrapure equimolar single crystals of the formula $ARF_4$ from a congruent melt, wherein A is lithium and R is selected from the roup consisting of holmium, yttrium, erbium, thulium and dysprosium, comprising the steps of forming a molten starting compound according to the following equation;

$$AF + RF_3 = ARF_4$$

by reacting stoichiometric amounts of each starting material in the presence of a dynamic HF atmosphere for approximately 24 hours at an elevated temperature, allowing said reacted material to cool in the presence of said HF atmosphere, initiating crystal nucleation during said cooling process by immersing a nucleation rod within said molten reactants and pulling a single crystal on said nucleation rod while maintaining said HF atmosphere; wherein the process of forming said molten starting compound comprises the steps of;

a. placing equimolar amounts of reactants AF and $RF_3$ into a vitreous carbon or platinum crucible;

b. inserting said crucible into a furnace, through outgassing said furnace and returning said furnace to atmospheric pressure with a dry helium purge;

c. introducing a reactive atmosphere into said furnace by causing HF gas to flow into said furnace;

d. causing said reactants to melt by slowly raising the temperature of said furnace until the melting point of said reactants has been exceeded whereby said reactants become molten over a 24 hour period; and e. allowing said molten reactants to react in the presence of said reactive atmosphere at a steady state molten temperature for approximately 6 hours;

and the crystal growth process comprises the steps of;

f. reducing the temperature of said furnace to the proximity of the melting point of said reactants;

g. causing said molten reactants to nucleate by immersing a nucleation rod into said reactant melt;

h. pulling a single crystal on said nucleated rod by slowly withdrawing said rod from said melt while rotating said rod in said reactive atmosphere;

i. causing said crystal to separate from said melt by increasing the temperature of said furnace and the pull rate of said rod;

j. allowing said crystal to cool to room temperature in the presence of said reactive atmosphere; and k. purging said furnace with an inert gas.

7. The process of claim 6 wherein R is yttrium.

8. The process of claim 6 wherein R is erbium.

9. The process of claim 6 wherein R is a mixture of yttrium and erbium.

10. The process of claim 1 wherein R is holium.

* * * * *

UNITED STATES PATENT OFFICE
CERTIFICATE OF CORRECTION

PATENT NO. : 3,959,442
DATED : May 25, 1976
INVENTOR(S) : RICARDO C. PASTOR ET AL

It is certified that error appears in the above-identified patent and that said Letters Patent are hereby corrected as shown below:

Column 2, line 6, "LiYF" should read --side--.

Column 5, line 11, "roup" should read --group--.

Signed and Sealed this

Sixteenth Day of November 1976

[SEAL]

Attest:

RUTH C. MASON
*Attesting Officer*

C. MARSHALL DANN
*Commissioner of Patents and Trademarks*